United States Patent [19]

Taylor et al.

[11] Patent Number: 4,635,246

[45] Date of Patent: Jan. 6, 1987

[54] FREQUENCY MULTIPLEX SYSTEM USING INJECTION LOCKING OF MULTIPLE LASER DIODES

[75] Inventors: Henry F. Taylor, Alexandria, Va.; Joseph F. Weller, Fort Washington, Md.; Lew Goldberg, Alexandria, Va.

[73] Assignee: The United States of America as represented by the Secretary of the Navy, Washington, D.C.

[21] Appl. No.: 543,680

[22] Filed: Oct. 20, 1983

[51] Int. Cl.⁴ ............................................... H04B 9/00
[52] U.S. Cl. ............................................ 370/3; 372/18; 455/617; 455/619
[58] Field of Search ............... 370/1, 2, 3; 372/18, 372/20, 22, 23, 32; 455/606, 607, 612, 617, 619

[56] References Cited

U.S. PATENT DOCUMENTS

| 3,633,123 | 1/1972 | Marcatili . | |
| 3,676,684 | 7/1972 | De Lange . | |
| 3,691,483 | 9/1972 | Klein | 372/18 |
| 3,747,004 | 7/1973 | Sasnett | 372/18 |
| 3,788,743 | 1/1974 | George | 455/619 |
| 3,920,983 | 11/1975 | Schafer et al. | 370/3 |
| 4,206,347 | 6/1980 | Avicola et al. | 370/4 |

FOREIGN PATENT DOCUMENTS

| 56-149837 | 11/1981 | Japan | 370/3 |
| 56-149838 | 11/1981 | Japan | 370/3 |

OTHER PUBLICATIONS

Kobayashi et al—Injection Locking Characteristics—IEEE Journal of Quantum Electronics, vol. QE-16, No. 9, Sep. 1980, pp. 915-917.

Primary Examiner—Joseph A. Orsino, Jr.
Attorney, Agent, or Firm—Sol Sheinbein; Alan P. Klein

[57] ABSTRACT

An optical frequency division multiplex system including a transmitter, a receiver, and a transmission path connecting the transmitter to the receiver. In the transmitter a master laser is operated to produce a central peak at an optical frequency $f_o$ with side peaks separated by an amount $\Delta f$ running to both sides of the central peak. The master laser output goes through an optical isolator to an optical coupler where it is split up into $N+1$ beams. Each optical output from the coupler is then positioned to be coupled into N slave lasers. Each slave laser is tuned to approximately coincide with one of the side peaks thus producing a single output frequency of $(f_o \pm n\Delta f)$ from each slave laser diode. Electrical modulating signals for each of N information channels are applied separately to modulate the phase of each of the slave laser outputs. The outputs of the slave lasers are then recombined in a $N \times 1$ optical coupler, the output of which is transmitted over a single-mode fiber linking the transmitter to the receiver. One of the outputs of the $1 \times (N+1)$ coupler is transmitted to the receiver over a second single-mode fiber. At the receiver, the master laser carrier is split into N spatial components by a $1 \times N$ coupler. These are then filtered and amplified by a second group of N slave lasers. The output from this second unmodulated group of slave lasers is combined with the combined outputs from the modulated slave lasers in an array of $2 \times 1$ optical couplers. Finally, the light signals emerging from the couplers are converted to electrical signals for the N information channels by an array of photodetectors.

22 Claims, 12 Drawing Figures

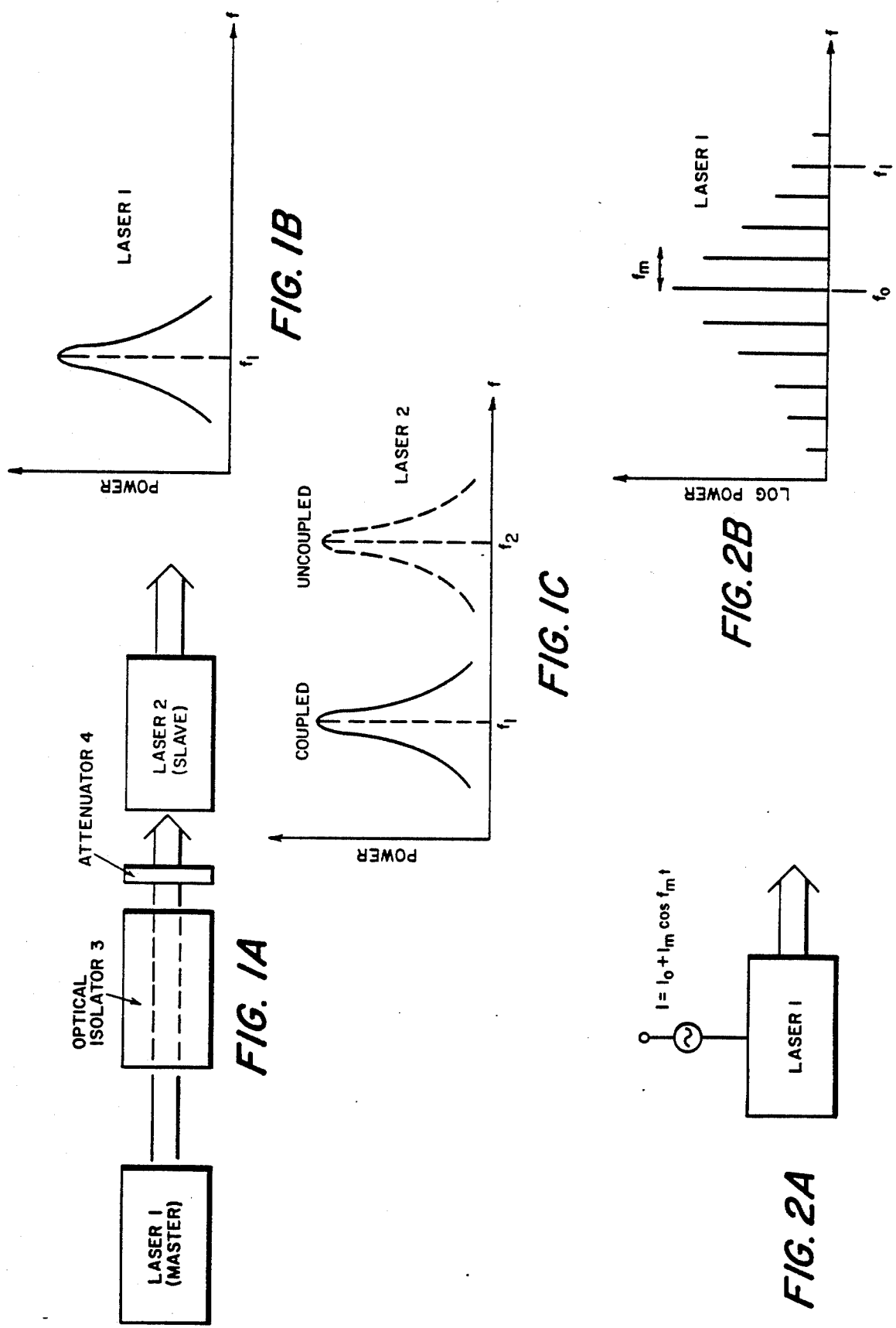

MASTER LASER

SLAVE LASER #1

SLAVE LASER #2

SLAVE LASER #3

FREQUENCY-
MULTIPLEXED OUTPUT
OF #1,2,3 AND
MASTER

FREQUENCY MULTIPLEX SYSTEM USING INJECTION LOCKING OF MULTIPLE LASER DIODES

BACKGROUND OF THE INVENTION

This invention relates generally to multiplex communications, and more particularly to optical frequency division multiplex communications.

Multiplexing as applied to transmission systems, is a scheme of utizing the same transmission path for many different signals. However, in order that the signals be separable at the output end of the transmission path, each must be uniquely different from all of the others. In a frequency division multiplex system, to which the present invention relates, each signal, or channel of the system, is assigned a discrete portion of the transmitted frequency spectrum. Thus, many relatively narrow bandwidth channels can be accommodated within a single bandwidth transmission system Recent interest in optical communications—the transmission of information using light as a carrier—has produced a need for a frequency division multiplex communication system that is optical in nature.

SUMMARY OF THE INVENTION

Accordingly, it is an object of the present invention to use the same optical transmission path for many different signals.

Another object is to use injection-locking of lasers to construct an optical frequency division multiplex communication system.

These and other objects of the present invention are achieved by a frequency-division multiplex communication system which includes a transmitter, a receiver, and a transmission path connecting the transmitter to the receiver. The transmitter comprises a source of signals of different frequencies, and a multiplexer having N branches connected to the source. Each branch of the multiplexer includes a slave laser adjusted to operate at approximately the frequency of one of the source signals to transmit a corresponding carrier signal at that frequency, and an associated modulator for modulating the output of each slave laser by a different channel information signal. The receiver comprises a demultiplexer having N branches. Each branch of the demultiplexer includes a slave laser adjusted to operate at approximately the frequency of one of the source signals, and a photodetector for detecting the channel information signal modulating the transmitted carrier signal at whose frequency the associated slave laser in the demultiplexer branch is adjusted to operate.

In another aspect, the invention is concerned with the transmitter itself.

Additional features will become apparent as the subject invention becomes better understood by reference to the following detailed description when considered in conjunction with the accompanying drawings wherein:

BRIEF DESCRIPTION OF THE DRAWINGS

FIGS. 1A–1C show the operation of an injection-locked laser;

FIGS. 2A and 2B show the operation of a frequency-modulated laser diode;

DESCRIPTION OF THE PREFERRED EMBODIMENT

Figure 3:
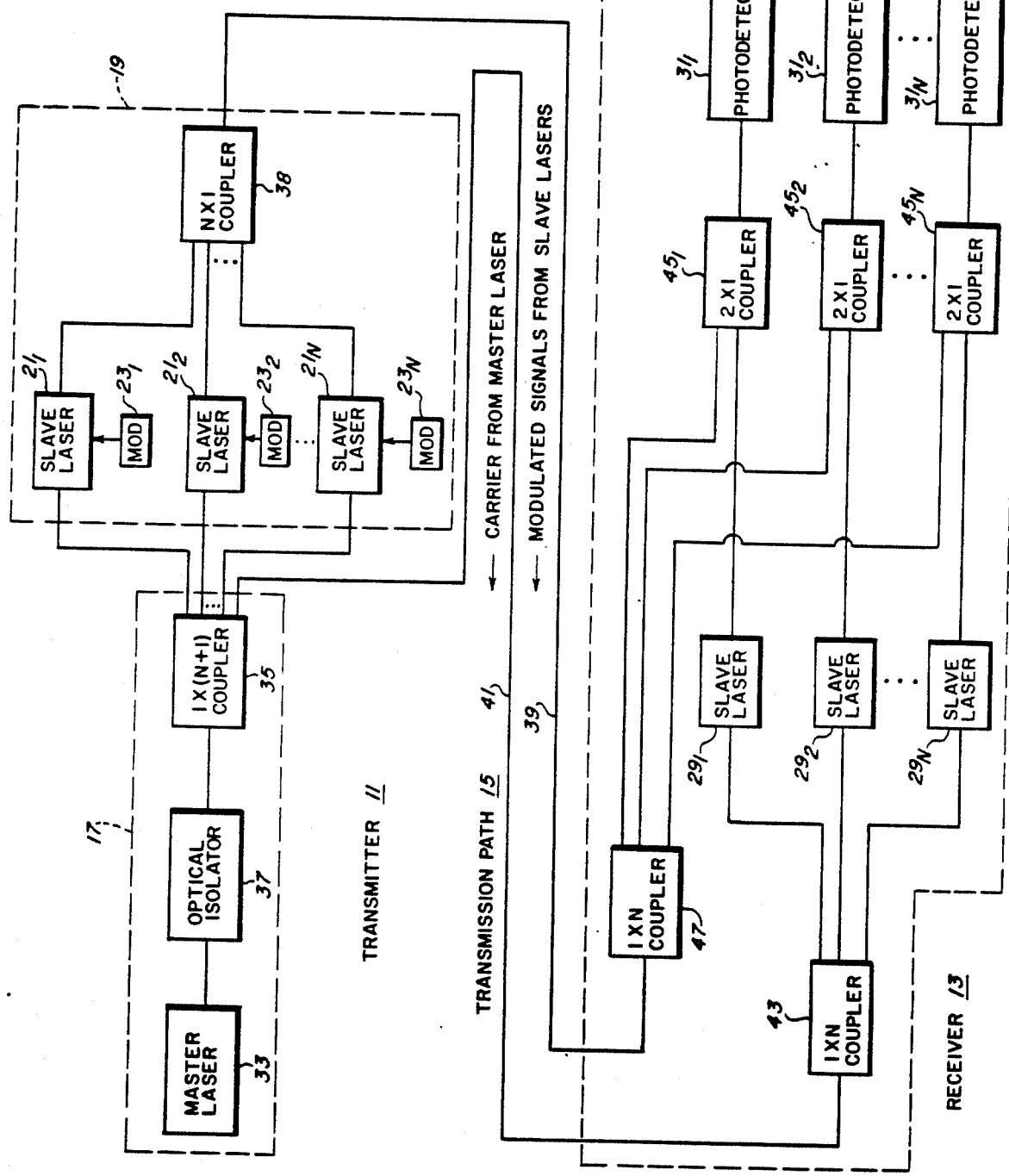
FIG. 3 is a block diagram of an embodiment of the frequency-division multiplex communication system of the invention.

Before presenting a detailed description of the present invention, the theory of its operation will be described hereinafter.

Injection of light from a frequency-stabilized laser oscillator into the cavity of a second laser is a well-known technique for stabilizing the frequency and phase of the second laser. Pictorially, the operation of an injection-locked laser is shown in FIGS. 1A–1C. Light at frequency $f_1$ from laser 1, commonly called the master laser, is passed through an optical isolator 3 and an attenuator 4 and enters laser 2. The isolator 3 prevents feedback from laser 2 or external reflections from reentering the cavity of laser 1 thus affecting the output of laser 1. If light from the master laser 1 is now blocked or prevented from entering laser 2, the two lasers are uncoupled and laser 2 operates at a frequency, $f_2$. If the light from the master laser 1 is now unblocked and allowed to enter laser 2, the output of laser 2 is pulled to the same frequency (and phase) as the master laser 1; for this reason, laser 2 is commonly called the slave laser. The frequency separation between the master laser and the slave laser in the uncoupled state, or the bandwidth over which $f_2$ can be locked to the frequency of the master laser depends on the amount of injected optical radiation. The latter can be controlled by the attenuator 4 placed before the slave laser 2.

Laser frequency locking was first experimentally demonstrated by injecting a HeNe laser beam into another HeNe laser. More recently the Japanese have demonstrated injection locking in semiconductor laser diodes at 0.83 μm: other researchers have also demonstrated injection-locked semiconductor lasers operating at 1.3 μm and 1.5 μm. Specific aspects of injection locking of laser diodes have been studied including bandwidth vs. gain characteristics, locking bandwidth asymmetry, amplification of FM optical signals, and control of mode hopping in a directly modulated laser. In order to understand the invention to be discussed, it is necessary to describe certain properties of semiconductor laser diodes that are unique to their operation. These include the dependence of the spectral output on temperature and injected current, mode spacing, and modulation properties of laser diodes.

In order to injection lock one laser to another, the lasers must operate within a specified spectral bandwidth of each other. The bandwidth is proportional to the square root of the ratio of the injected power $(P_i)$ to the single-facet output power from the slave laser $(P_s)$. For a commercial buried heterostructure laser operating at 0.83 μm, the bandwidth $(\Delta f)$ is $-100(P_i/P_s)^{\frac{1}{2}}$GHz. If the injected power is 20 dB lower than the slave laser output, the bandwidth would be 10 GHz. which at a wavelength of 0.83 μm is 0.2 Å. Laser diodes can be obtained commercially that have specified outputs within ±10 Å, so finer tuning must be used. This is normally accomplished by temperature and current tuning. Typical values for a commercially obtained buried heterostructure laser are 0.8 Å/°K for temperature tuning and 0.06 Å/mA (2.7 GHz/mA) for current tuning the laser with a variable DC current source. When the current driving the laser diode is modulated at high frequency, larger frequency deviations can be obtained due to a relaxation oscillation that occurs between the carrier and photon densities. For a transverse junction stripe laser, measured frequency deviations as large as 20 GHz/mA have been reported for a 2 GHz modulating frequency and a DC drive current 17% above threshold.

The spectral output of a laser diode depends on whether the laser operates in a single longitudinal mode or many longitudinal modes. In a single mode laser, the emitted power is concentrated in one wavelength region, whereas in a multimode laser, the power is distributed over many wavelength regions that are spaced in wavelength by $\lambda^2/2nl$ where $\lambda$ is the peak wavelength of operation, n is the refractive index of the laser medium, and l is the cavity length. By using an external mirror and varying the amount of light reflecting back into the laser cavity, the output power of the laser is also distributed into other wavelength regions that are spaced by $\lambda^2/2L$, where L is the separation between the external mirror and the output mirror of the laser diode.

The spectral properties of a laser diode up to this point can be obtained by a single dc bias.

If the laser diode is frequency modulated by superimposing an RF sinusoidal signal with frequency $f_m$ on the DC bias current, as shown in FIG. 2A, the frequency-modulated optical wave is represented by $E = E_o \exp[i\{2\pi f_o t + \beta \sin(2\pi f_m t)\}]$ (1)

with $$\beta = \Delta F/f_m \quad (2)$$

where $f_o$ is the emission frequency of the unmodulated laser, $\beta$ is the modulation index, $f_m$ is the modulating frequency, and $\Delta F$ is the maximum frequency deviation. Equation (1) can be expanded in terms of Bessel functions of the first kind to give $$E = J_o(\beta)f_o \sin 2\pi f_o t + J_1(\beta)E_o \cdot \sin\{2\pi(f_o + f_m)t\} - \quad (3)$$

$$J_1(\beta)E_o \cdot \sin\{2\pi(f_o - f_M)t\} + \ldots J_i(\beta)E_o \cdot$$

$$\sin\{2\pi(f_o + lf_m)t\} + (-1)^l J_i(\beta)E_o \cdot \sin\{2\pi(f_o - lf_m)t\}$$

The result is that the energy is distributed in sidebands as a function of the modulation index $\beta$. Pictorially, the output would appear as shown in FIG. 2B. With no modulating frequency, all of the energy appears at the optical carrier frequency, $f_o$. But with a modulating signal, $(I = I_o + I_m \cos f_m t$, where $I_o$ is the DC bias current and $I_m$ is the RF current) also applied to laser diode, sidebands are generated to both sides of the optical carrier frequency and spaced by $f_m$, the modulating carrier frequency. The number of sidebands and their relative intensities depends on $\beta$ or the factor $\Delta F/f_m$. Finally, if a laser diode is working in many modes, these modes can be locked in phase either by using an external cavity of an optimum length or self-induced sinusoidal modulation (normally called self-pulsation) that is unique to some laser diodes. Using this so called "mode locking" technique, the intensity consists of a periodic train with a period of $T = 2l/c$ (where l is the cavity length and c the velocity of light) with each pulse having a width equal to the reciprocal of the bandwidth of the oscillating modes.

One further result of the rate equations describing photon and carrier densities is that the efficiency for direct intensity modulation of a laser diode falls off at frequencies larger than 2 GHz. One can use external modulators such as a travelling wave modulator coupled to the laser diode and obtain intensity modulation up to 20 GHz but high resolution photo-lithography is required to fabricate the modulator.

Referring now to FIG. 3, there is shown the frequency-division multiplex communication system of the invention for transmitting signals for each of N information channels from the site of a transmitter 11 to the site of a receiver 13 by way of a transmission path 15.

The transmitter 11 includes a source 17 of signals of different frequencies, and a multiplexer 19 connected to the source. The multiplexer 19 has N branches, where N is an integer, each containing a slave laser $21_1, \ldots 21_n$ and an associated modulator $23_1, \ldots 23_N$. The modulators may be connected to a first plurality of subscribers who provide the signals for each of the N information channels.

The receiver 13 includes a demultiplexer 27. The demultiplexer 27 has N branches, each containing a slave laser $29_1, \ldots 29_N$ and an associated photodetector $31_1, \ldots 31_N$. The photodetectors may be connected to a second plurality of subscribers who recover the signals in each of the N information channels.

While the signal source 17 may take a variety of forms, conveniently it may take the form shown in FIG. 3 of a master laser 33, a $1 \times (N+1)$ optical coupler 35 connected between the master laser 33 and the N branches of the multiplexer 19, and an optical isolator 37 connected between the master laser 33 and the optical coupler 35.

The multiplexer 19 also includes an $N \times 1$ optical coupler 38 which is connected between the output ends of the N branches of the multiplexer 19 and the transmission path 15.

While the transmission path 15 may take a variety of forms, conveniently it may take the form shown in FIG. 3 of a single-mode optical fiber 39 connected between the $N \times 1$ optical coupler 38 and the receiver 13, and another single-mode optical fiber 41 connected between the $1 \times (N+1)$ optical coupler 35 and the receiver 13.

The demultiplexer 27 includes a $1 \times N$ optical coupler 43 connected between the optical fiber 41 and the input ends of the N branches of the demultiplexer 27. Each branch of the demultiplexer 27 contains a $2 \times 1$ optical coupler $45_1, \ldots 45_N$ which is connected between the branch's photodetector $31_1, \ldots 31_N$ and slave laser $29_1, \ldots 29_N$.

The demultiplexer 27 additionally includes a $1 \times N$ optical coupler 47 which is connected between the optical fiber 39 and the N optical couplers $45_1, \ldots 45_N$.

The illustrated optical couplers may take a variety of forms, such as, for example, bulk beam splitters, fiber optic couplers, or integrated optic star couplers.

Figure 4:
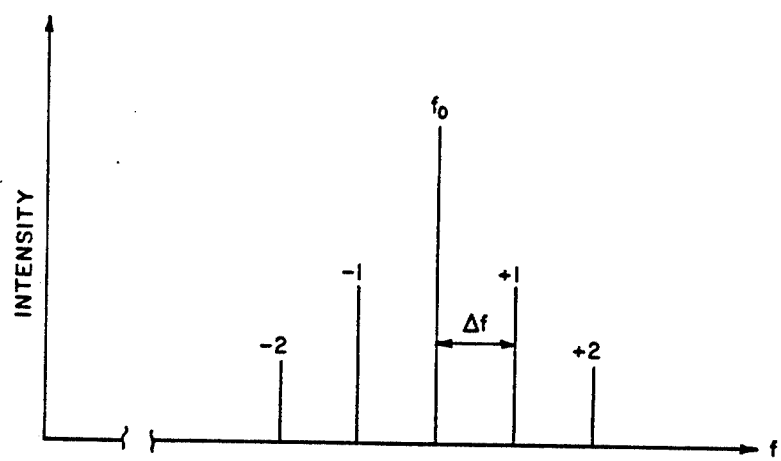
FIG. 4 shows the spectral output of a laser operated to obtain more than one frequency.

In operation, in the transmitter 11, the master laser 33 generates an optical output at a frequency $f_o$ and sidebands at multiples of $\Delta f$. As discussed previously, there are several ways to obtain a spectral output of a laser diode at more than one frequency; these include FM modulation and multi-mode operation where the phases of each longitudinal mode are either random (unlocked) or fixed (locked in some relationship to each other). The spectral output of the master laser is pictorially shown in FIG. 4. There is a central peak at an optical frequency $f_o$ with side peaks separated by an amount $\Delta f$ running to both sides of the central peak. For FM modulation, $\Delta f$ is simply the modulating frequency: whereas in the case of a multimode laser, $\Delta f$ is the frequency separation $c/2nl$, the longitudinal mode spacing, for which c is the velocity of light, n is the refractive index of the cavity, and l is the cavity length. One other possibility occurs when the laser diode is operated in an external cavity and additional modes spaced by $c/2L$ occur, where L is the spacing between the external cavity mirror and the adjacent laser diode facet. Typically for FM modulation, $\Delta f$ is greater than 1 GHz, for laser cavity modes $\Delta f$ is on the order of 150 GHz, and for external cavity modes $\Delta f$ can be made with spacings 100 GHz to 1 MHz.

Referring again to FIG. 3, each of the slave lasers $21_1$, ... $21_N$ in the N branches of the multiplexer 19 is adjusted, for example, by temperature or current-tuning, to operate at approximately the frequency of one of the sideband signals from the master laser 33, thus producing a single output frequency ($f_o \pm n\Delta f$) from each slave laser. The optical isolator 37, which prevents feedback into the master laser 33, passes the output of the master laser to the $1 \times (N+1)$ optical coupler 35. The $1 \times (N+1)$ optical coupler 35 splits the optical output of the master laser 33 into a plurality of equal-power beams, and injects a respective beam into each branch of the multiplexer 19 to lock the slave lasers $21_1, \ldots 21_N$ to the respective sideband frequencies. Each slave laser $21_1, \ldots 21_N$ transmits a carrier signal at its injection-locked frequency to the Nxl coupler 38. Electrical modulating signals for each of N information channels are applied separately to the modulators $23_1, \ldots 23_N$ to modulate the outputs of each of the associated slave lasers. The Nxl optical coupler 38 combines the outputs from the slave lasers $21_1, \ldots 21_N$ into a composite output beam for transmission over the optical fiber 39 to the receiver 13.

Figure 5A:
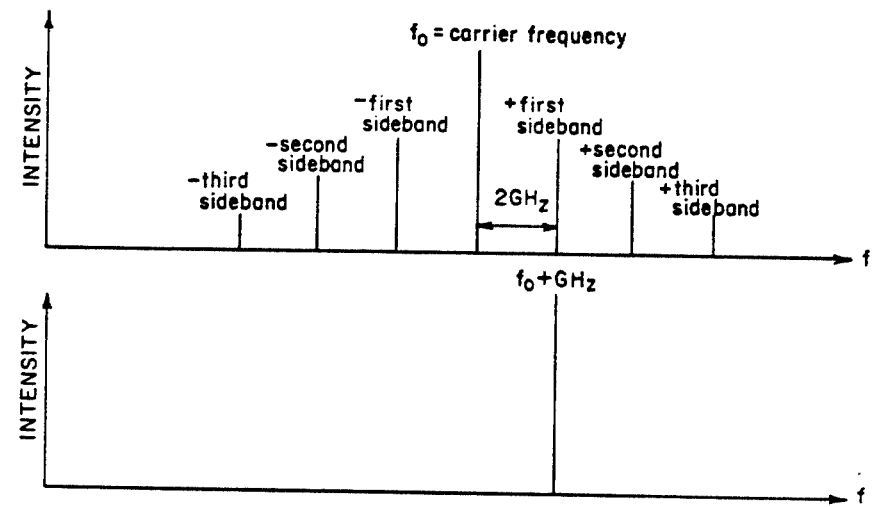
FIGS. 5A–5E show the operation of the transmitter of the invention.
Figure 5B:
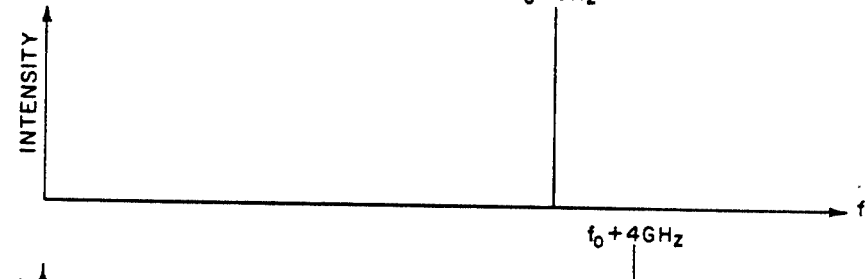
Figure 5C:
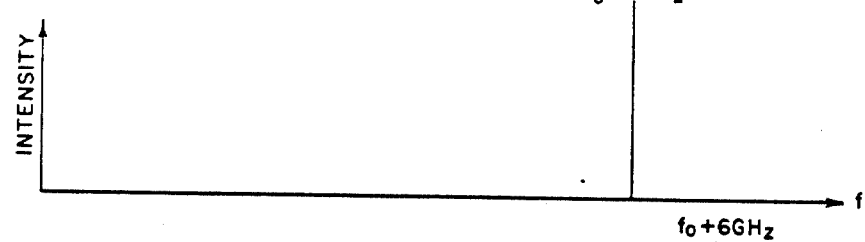
Figure 5D:
Figure 5E:
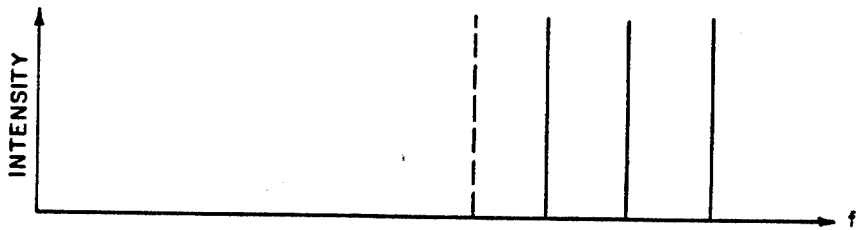

To see how this works, FIG. 5A shows the spectral output of a laser diode FM modulated at 2 GHz, generating 3 sidebands to the high frequency side and 3 sidebands to the low frequency side of the carrier frequency $f_o$. A slave laser #1 is tuned oscillate at $f_o+2$ GHz as shown in FIG. 5B. Similarly, laser #2 and laser #3 are tuned, pulled in, and locked to ($f_o+4$ GHz) and ($f_o+6$ GHz), respectively, as depicted in FIGS. 5C-5D. These 3 outputs are then combined in a $3 \times 1$ optical coupler to form a frequency-multiplexed source operating at ($f_o+2$ GHz), ($f_o+4$ GHz), and ($f_o+6$ GHz) as shown in FIG. 5E.

Experimentally the concept has been demonstrated for one slave laser injected by a master laser that was FM modulated at 1.5-2.5 GHz. Locking to a sideband as far as 9.5 GHz removed from the fundamental optical carrier was observed. These results are presented in the paper by the inventors, entitled "FM Sideband Injection Locking of Diode Lasers," in Electronic Letters, Vol. 18, No. 23, pp. 1019-1020 (Nov. 11, 1982).

In the receiver 13, each of the slave lasers $29_1, \ldots 29_N$ in the N branches of the demultiplexer 27 is adjusted to operate at approximately the frequency of one of the sideband signals from the master laser 33. The optical fiber 41 transmits to the receiver 13 one of the beams into which the optical output of the master laser 33 is split by the $1 \times (N+1)$ optical coupler 35. The $1 \times N$ optical coupler 43 splits the received beam into N sub-beams and injects a respective sub beam into each of the N branches of the demultiplexer 27 to lock the slave lasers $29_1, \ldots 29_N$ therein to the respective sideband frequencies. The $2 \times 1$ optical coupler $45_1 \ldots 45_N$ in each branch then couples the output of the slave laser in that branch to the associated photodetector $31_1, \ldots 31_N$. The composite output beam transmitted from the transmitter 11 by the optical fiber 39 is also split by a $1 \times N$ optical coupler 47 into another N sub-beams which it injects into each $2 \times 1$ coupler $45_1, \ldots 45_N$ to mix, with the coupled output of the associated slave laser $29_1, \ldots 29_N$ on the face of the associated photodetector $31_1, \ldots 31_N$. Each of the N photodetectors $31_1, \ldots 31_N$ then produces an electrical signal having the form of the channel information signal modulating the transmitted carrier signal at whose frequency its associated slave laser $29_1, \ldots 29_N$ is adjusted to operate. The higher frequency beat signals are suppressed by the response curve of the photodetector, or alternatively a low-pass filter can be provided.

Thus, there has been presented a novel frequency-division multiplex scheme permitting the transmission of two or more channels of information over a single-mode fiber. The multiplex action is accomplished by locking slave lasers to FM sidebands of a modulated master laser.

An advantage of the invention is that a laser diode output can be modulated at high frequencies that are not obtainable by direct current modulation or by the use of external modulators. Since certain laser diode structures are capable of 20 GHz/ma frequency deviations, FM sidebands separated by 100 GHz from the optical carrier can be obtained with moderate current inputs that are modulated at reasonable frequencies. Therefore lasers operating with large frequency separations can be injection locked. A phased-locked frequency array can be made whereby each individual laser diode in the array can carry information, thus increasing the total bandwidth of the transmitter. By beating two slave lasers locked to two different sidebands of the master laser, a beat signal can be generated in a variety of semiconductor devices for locking the device to a fixed frequency. These devices include FET oscillators and amplifiers, impatt diodes, Gunn devices, etc. Since the fluctuations in phase of the two slave lasers are correlated and their emission frequencies are locked, the beat signal is much narrower and frequency stable than could be obtained by beating two free running lasers.

In communications, an injection-locked diode laser performs the functions of bandpass filter, amplifier, and phase shifter. One can envision an array of slave lasers injection-locked to different harmonics of a single FM-modulated master laser, with each slave laser used as an independent oscillator for frequency multiplexed transmission. Phase modulation in each channel would be accomplished by varying the current to the appropriate slave laser. The channels could all be combined by a star coupler for transmission over a single fiber, and separated at the receiver end by a second star coupler. Heterodyne demodulation could be accomplished using an array of cw slave laser local oscillators locked to the appropriate ML harmonics. Such a system would suffer a substantial power penalty from splitting at the star couplers, but might still be useful for transmitting very high bandwidths over distances up to a few kilometers.

Obviously, numerous modifications and variations of the present invention are possible in light of the above teachings. It is therefore to be understood that within the scope of the appended claims, the invention may be practiced otherwise than as specifically described herein.

What is claimed and desired to be secured by letters patent of the United States is:

1. A transmitter comprising: a source of signals of different frequencies; and a multiplexer connected to the source and having N branches, each branch including a slave laser adjusted to operate at approximately the frequency of one of the source signals to transmit a corresponding carrier signal at the frequency, and each branch also including an associated modulator for modulating the output of each slave laser by a different channel information signal;

a receiver including a demultiplexer having N branches, each branch including a slave laser adjusted to operate at approximately the frequency of one of the source signals; and a transmission path connecting the transmitter to the receiver.

2. The combination recited in claim 1 wherein each branch of the demultiplexer includes:

a photodetector for detecting the channel information signal modulating the transmitted carrier signal at whose frequency the associated slave laser in the demultiplexer branch is adjusted to operate.

3. The transmitter recited in claim 1 wherein the signal source includes:

a master laser for generating an optical output at a frequency $f_o$ and sidebands at multiples of $\Delta f$.

4. The system recited in claim 3 wherein the signal source includes:

an optical coupler connected between the master laser and the N branches of the multiplexer for splitting the optical output of the master laser into a plurality of beams and injecting a respective beam into each branch of the multiplexer to lock the slave lasers in the multiplexer to respective sideband frequencies in the optical output of the master laser.

5. A frequency division multiplex communication system comprising:

a master laser for generating an optical output at a frequency $f_o$ and sidebands at multiples of $\Delta f$;

a multiplexer connected to the master laser and having N branches, each branch including a slave laser adjusted to operate at approximately the frequency of one of the sidebands to transmit a corresponding carrier signal at that frequency, and each branch also including an associated modulator for modulating the output of each slave laser by a different channel information signal:

a first optical coupler connected between the master laser and the N branch of the multiplexer for splitting the optical output of the master laser into a plurality of beams and injecting a respective beam into each branch of the multiplexer to lock the slave lasers in the multiplexer to respective sideband frequencies in the optical output of the master laser;

a demultiplexer having N branches, each branch of the demultiplexer including a slave laser adjusted to operate at approximately the frequency of one of the sidebands, and each branch of the demultiplexer also including a photodetector for detecting the channel information signal modulating the transmitted carrier signal at whose frequency the associated slave laser in the demultiplexer branch is adjusted to operate; and a transmission path connecting the multiplexer to the demultiplexer.

6. The system recited in claim 5 wherein the multiplexer includes:

a second optical coupler connected between the N branches of the multiplexer and the transmission path for combining the N outputs from the slave lasers in the branches of the multiplexer into a composite output beam for transmission over the transmission path.

7. The system recited in claim 6 wherein the transmission path includes:

a first single-mode optical fiber connected between the second optical coupler and the demultiplexer for transmitting to the demultiplexer the composite output beam from the second optical coupler.

8. The system recited in claim 7 wherein the transmission path includes:

a second single-mode optical fiber connected between the first optical coupler and the demultiplexer for transmitting to the demultiplexer one of the beams into which the optical output of the master laser is split by the first optical coupler.

9. The system recited in claim 8 wherein the demultiplexer includes:

a third optical coupler connected between the second single-mode optical fiber and the N branches of the demultiplexer for splitting the transmitted beam into N first sub-beams and injecting a respective first sub-beam into each of the N branches of the demultiplexer to lock the slave lasers therein to respective sideband frequencies in the optical output of the master laser.

10. The system recited in claim 9 wherein each branch of the demultiplexer includes:

a fourth optical coupler connected between the photodetector and the slave laser in the branch of the demultiplexer for coupling the output of the slave laser in the branch of the demultiplexer to the photodetector therein.

11. A frequency division multiplex communication system comprising:

a master laser for generating an optical output at a frequency $f_o$ and sidebands at multiples of $\Delta f$:

a multiplexer connected to the master laser and having N branches, each branch including a slave laser adjusted to operate at approximately the frequency of one of the sidebands to transmit a corresponding carrier signal at that frequency, and each branch also including an associated modulator for modulating the output of each slave laser by a different channel information signal a first optical coupler connected between the master laser and the N branches of the multiplexer for splitting the optical output of the master laser into a plurality of beams and injecting a respective beam into each branch of the multiplexer to lock the slave lasers in the multiplexer to respective sideband frequencies in the optical output of the master laser;

a demultiplexer having N branches, each branch of the demultiplexer including a slave laser adjusted to operate at approximately the frequency of one of the sidebands, and each branch of the demultiplexer also including a photodetector for detecting the channel information signal modulating the transmitted carrier signal at whose frequency the associated slave laser in the demultiplexer branch is adjusted to operate; and a transmission path connecting the multiplexer to the demultiplexer, the multiplexer including a second optical coupler connected between the N branches of the multiplexer and the transmission path for combining the N outputs from the slave lasers in the branches of the multiplexer into a composite output beam for transmission over the transmission path, the transmission path including a first single-mode optical fiber connected between the second optical coupler and the demultiplexer for transmitting to the demultiplexer the composite output beam from the second optical coupler, and a second single-mode optical fiber connected between the first optical coupler and the demultiplexer for transmitting to the demultiplexer one of the beams into which the optical output of the master laser is split by the first optical coupler, the demultiplexer including a third optical coupler connected between the second single mode optical fiber and the N branches of the demultiplexer for splitting the transmitted beam into N first sub-beams and injecting a respective first sub-beam into each of the N branches of the demultiplexer to lock the slave lasers therein to respective sideband frequencies in the optical output of the master laser, N fourth optical couplers respectively connected in each branch of the demultiplexer between the slave laser and photodetector therein for coupling the output of the slave laser therein to the photodetector therein, and a fifth optical coupler connected between the first single-mode fiber and the N fourth couplers for splitting the composite output beam into N second sub-beams and injecting a respective sub-beam into each fourth optical coupler to mix with the coupled output of the associated slave laser on the face of the assounted photodetector.

12. A frequency-division multiplex communication method comprising the steps of:

originating signals of different frequencies:

adjusting a slave laser in each of N branches of a multiplexer to operate at approximately the frequency of one of the originated signals to transmit a corresponding carrier signal at that frequency:

modulating the output of each slave laser by a different channel information signal;

adjusting a slave laser in each of N branches of a demultiplexer to operate at approximately the frequency of one of the generated signals; and detecting in each of the N branches of the demultiplexer the channel information signal at whose frequency the slave laser in that branch of the demultiplexer is adjusted to operate.

13. The method recited in claim 12 wherein the originating step includes:

generating with a master laser an optical output at a frequency $f_o$ and sidebands at multiples of $\Delta f$.

14. The method recited in claim 13 wherein the originating step includes:

splitting the optical output of the master laser into a plurality of beams.

15. The method recited in claim 14 wherein the originating step includes:

injecting a respective beam into each branch of the multiplexer to lock the slave lasers in the multiplexer to respective sideband frequencies in the optical output of the master laser.

16. The method recited in claim 15 including the step of:

combining the N outputs from the slave lasers in the branches of the multiplexer into a composite output beam.

17. The method recited in claim 16 including the step of:

transmitting the composite output beam over a transmission path.

18. The method recited in claim 17 including the step of:

transmitting one of the plurality of split beams from the optical output of the master laser over a transmission path.

19. The method recited in claim 18 including the step of:

splitting the transmitted one of the plurality of split beams into N first sub beams.

20. The method recited in claim 19 including the step of:

injecting a respective first sub-beam into each of the N branches of the demultiplexer to lock the slave lasers therein to respective sideband frequencies in the optical output of the master laser.

21. The method recited in claim 20 including the step of splitting the transmitted composite output beam into N second sub-beams.

22. The method recited in claim 21 including the step of:

coupling respective second sub-beams and the outputs of the slave lasers in each branch of the demultiplexer to photodetectors disposed in each branch of the demultiplexer to photodetectors disposed in each branch of the demultiplexer.

* * * * *